(12) United States Patent
Hamada et al.

(10) Patent No.: US 11,125,814 B2
(45) Date of Patent: Sep. 21, 2021

(54) TEST SYSTEM

(71) Applicant: SINTOKOGIO, LTD., Nagoya (JP)

(72) Inventors: Takayuki Hamada, Aichi (JP); Yoichi Sakamoto, Aichi (JP)

(73) Assignee: SINTOKOGIO, LTD., Nagoya (JP)

( * ) Notice: Subject to any disclaimer, the term of this patent is extended or adjusted under 35 U.S.C. 154(b) by 148 days.

(21) Appl. No.: 16/482,830

(22) PCT Filed: Dec. 19, 2017

(86) PCT No.: PCT/JP2017/045546
§ 371 (c)(1),
(2) Date: Aug. 1, 2019

(87) PCT Pub. No.: WO2018/154941
PCT Pub. Date: Aug. 30, 2018

(65) Prior Publication Data
US 2019/0353701 A1    Nov. 21, 2019

(30) Foreign Application Priority Data
Feb. 22, 2017 (JP) .............................. JP2017-031180

(51) Int. Cl.
*G01R 31/00* (2006.01)
*G01R 31/28* (2006.01)
(Continued)

(52) U.S. Cl.
CPC ..... *G01R 31/2887* (2013.01); *G01R 31/2886* (2013.01); *G01R 31/2889* (2013.01);
(Continued)

(58) Field of Classification Search
CPC ............ G01R 31/2887; G01R 31/2891; G01R 31/2886; G01R 31/2893; G01R 31/2889;
(Continued)

(56) References Cited

U.S. PATENT DOCUMENTS

2010/0271062 A1  10/2010 Breinlinger et al.
2010/0301889 A1* 12/2010 Sakata ............... G01R 31/2889
                                                          324/756.07
(Continued)

FOREIGN PATENT DOCUMENTS

JP    S61-15341 A    1/1986
JP    H03-41466 Y2   8/1991
(Continued)

OTHER PUBLICATIONS

JP 2568104 machine translation, Dec. 25, 1996 (Year: 1996).*
International Preliminary Report on Patentability dated Sep. 6, 2019 for PCT/JP2017/045546.

*Primary Examiner* — Raul J Rios Russo
(74) *Attorney, Agent, or Firm* — Faegre Drinker Biddle & Reath LLP

(57) ABSTRACT

A test system configured to perform an electrical-characteristic test on a device under test, includes: a mount on which the device under test is to be mounted; a conveyance mechanism configured to convey the mount; a test head including a measurement circuit for performing the electrical-characteristic test; a probe configured to connect an electrode of the device under test to the measurement circuit; a lifting and lowering mechanism configured to move the mount along a first direction such that the electrode and the probe are in contact or spaced apart; and an alignment mechanism provided at the test head, the alignment mechanism being configured to move the probe on a plane crossing the first direction so as to align the probe with the electrode on the plane.

8 Claims, 8 Drawing Sheets

(51) Int. Cl.
  *G01R 1/04* (2006.01)
  *G01R 1/073* (2006.01)
(52) U.S. Cl.
  CPC ..... *G01R 31/2891* (2013.01); *G01R 31/2893* (2013.01); *G01R 1/0408* (2013.01); *G01R 1/0491* (2013.01); *G01R 1/07342* (2013.01)
(58) Field of Classification Search
  CPC . G01R 1/0408; G01R 1/0491; G01R 1/07342
  USPC ......... 324/71, 378, 403, 415, 425, 500, 537, 324/750.16, 750.19
  See application file for complete search history.

(56) References Cited

U.S. PATENT DOCUMENTS

| | | | |
|---|---|---|---|
| 2012/0249172 A1* | 10/2012 | Cameron | G01R 31/2601 324/750.16 |
| 2014/0145742 A1* | 5/2014 | Sugai | G01R 31/2889 324/756.03 |
| 2018/0113165 A1* | 4/2018 | Sakamoto | G01R 31/2891 |
| 2018/0348292 A1* | 12/2018 | Takita | G01R 31/2608 |

FOREIGN PATENT DOCUMENTS

| | | |
|---|---|---|
| JP | 2568104 B2 | 12/1996 |
| JP | 2006-317346 A | 11/2006 |
| JP | 2007-95993 A | 4/2007 |
| JP | 2016-206150 A | 12/2016 |

* cited by examiner (a)

(b)

TEST SYSTEM

TECHNICAL FIELD

The present disclosure relates to a test system.

BACKGROUND ART

A test system that inspects a device, such as a power semiconductor, has been known. For example, Patent Literature 1 describes a probing system including: a chuck stage that retains a device; and a probe that connects a terminal of a tester to an electrode of the device. In the probing system, the chuck stage is movable triaxially and is rotatable around the Z axis, and the probe is fixed at a tester fixed stand. In a case where the device is inspected with the chuck stage, the device retained on the chuck stage is captured, and the chuck stage rotates and moves in an X-axis direction and a Y-axis direction such that the electrode of the device is aligned with the leading-end position of the probe. After that, the chuck stage lifts along a Z-axis direction to render the probe in contact with the electrode.

CITATION LIST

Patent Literature

Patent Literature 1: Japanese Unexamined Patent Publication No. 2006-317346

SUMMARY OF INVENTION

Technical Problem

However, because the chuck stage includes a triaxial movement mechanism and a rotation mechanism, the weight of the chuck stage is large. Thus, the time necessary for the chuck stage to move to a loading position, an inspection position, and an unloading position, and the time necessary for the chuck stage to lift and lower at the inspection position, are long, so that there is a possibility that the efficiency of inspection deteriorates. In contrast to this, it is considered that the triaxial movement mechanism and the rotation mechanism are provided to the probe. In the configuration, there is a need to lengthen an electric wire for connecting the probe and a measurement circuit, to the extent that the probe can move. Thus, the inductance component increases in the electric wire, so that there is a possibility that the accuracy of measurement deteriorates.

In the present technical field, it is desirable that conveyance time be shortened with no deterioration in the accuracy of measurement.

Solution to Problem

A test system according to one aspect of the present disclosure performs an electrical-characteristic test on a device under test. The test system includes: a mount on which the device under test is to be mounted; a conveyance mechanism configured to convey the mount; a test head including a measurement circuit for performing the electrical-characteristic test; a probe configured to connect an electrode of the device under test to the measurement circuit; a lifting and lowering mechanism configured to move the mount along a first direction such that the electrode and the probe are in contact or spaced apart; and an alignment mechanism provided at the test head, the alignment mechanism being configured to move the probe on a plane crossing the first direction so as to perform aligning the probe with the electrode on the plane.

According to the test system, the position of the probe is aligned with the position of the electrode of the device under test by moving the probe on the plane crossing the first direction. Then, the lifting and lowering mechanism moves the mount on which the device under test is mounted along the first direction such that the electrode of the device under test is in contact with the probe. This arrangement allows the performance of the electrical-characteristic test on the device under test with the measurement circuit. The electrode of the device under test is spaced apart from the probe by moving the mount along the first direction. Thus, because the mount on which the device under test is to be mounted is provided with no movement mechanism and no rotation mechanism for the aligning of the electrode and the probe, the weight of the mount can be reduced in comparison to that of a mount provided with a triaxial movement mechanism and a rotation mechanism. This arrangement enables conveyance time to be shortened. The mount moves along the first direction in order to render the electrode of the device under test and the probe in contact or spaced apart, whereas the probe does not move along the first direction. Thus, because the distance in the first direction between the probe and the measurement circuit is inhibited from varying during the operation of the test system, there is no need to lengthen the length of an electric wire for electrically connecting the probe and the measurement circuit more than necessary. This arrangement enables reduction of the inductance component in the electric wire in comparison to that of a probe provided with a triaxial movement mechanism and a rotation mechanism. As a result, the conveyance time can be shortened with no deterioration in the accuracy of measurement.

In one embodiment, the conveyance mechanism may convey the mount in order of a first station for mounting the device under test on the mount, a second station for performing the electrical-characteristic test, and a third station for carrying out the device under test from the mount. In this case, use of three mounts makes it possible simultaneously to mount a device under test, perform an electrical-characteristic test, and extract a device under test.

The test system according to one embodiment may further include: a first imaging device configured to capture the device under test mounted on the mount in the first station. The alignment mechanism may perform the aligning, based on an image of the device under test captured by the first imaging device. In this case, the acquisition of the image of the device under test is performed in the first station and the electrical-characteristic test is performed in the second station. That is, based on the image of the device under test in the first station, the probe aligning is performed in the second station. Thus, the mount needs to stop accurately in the first station and the second station. As described above, because the mount is made lighter in weight, the inertial force that acts on the mount is reduced. Thus, because the time necessary for the mount to stop can be shortened, the conveyance time of the mount can be shortened.

The test system according to one embodiment may further include: a probe holder configured to retain the probe detachably; and a second imaging device configured to capture the probe. The alignment mechanism may perform the aligning, based on an image of the probe captured by the second imaging device. In this case, because the probe is detachable, the probe can be replaced. For example, due to the accuracy of retaining the probe by the probe holder, the position of the probe on the probe holder may vary every replacement of the probe. In contrast to this, because the position of the probe can be acquired based on the image of the probe, the aligning of the electrode of the device under test and the probe can be performed more accurately.

In one embodiment, the alignment mechanism may be capable of moving the probe in a second direction and a third direction defining the plane, and may be capable of rotating the probe around the first direction. In this case, by moving the probe in the second direction and the third direction and rotating the probe around the first direction, the position of the probe is aligned with the position of the electrode of the device under test.

Advantageous Effects of Invention

According to each aspect and each embodiment of the present disclosure, the test system that shortens the conveyance time with no deterioration in the accuracy of measurement can be provided.

DESCRIPTION OF EMBODIMENTS

Embodiments of the present disclosure will be described below with reference to the drawings. Note that, in the descriptions of the drawings, the same elements are denoted with the same reference signs and the duplicate descriptions thereof will be omitted.

Figure 1:
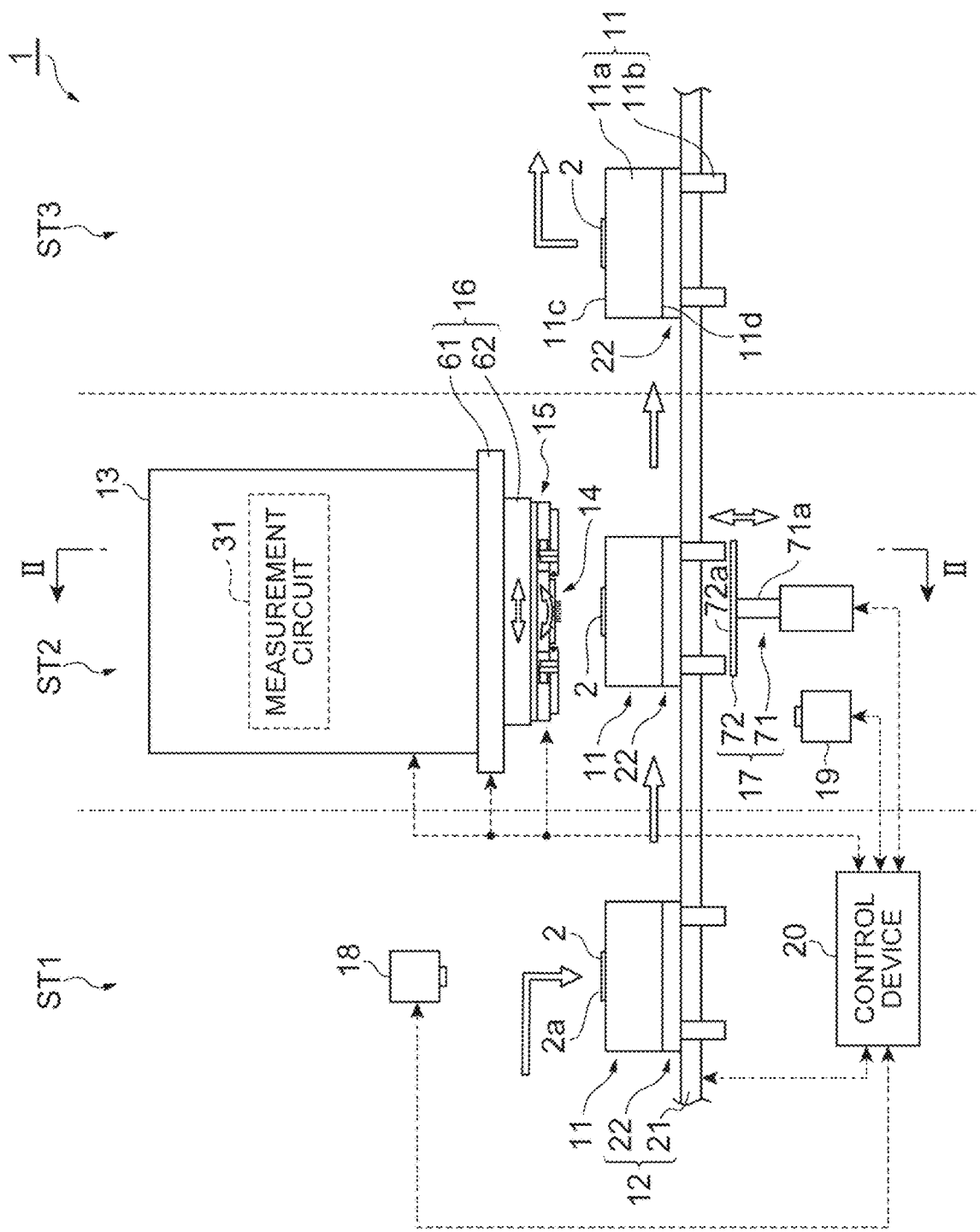
FIG. 1 is an external view schematically illustrating a test system according to a first embodiment.
Figure 2:
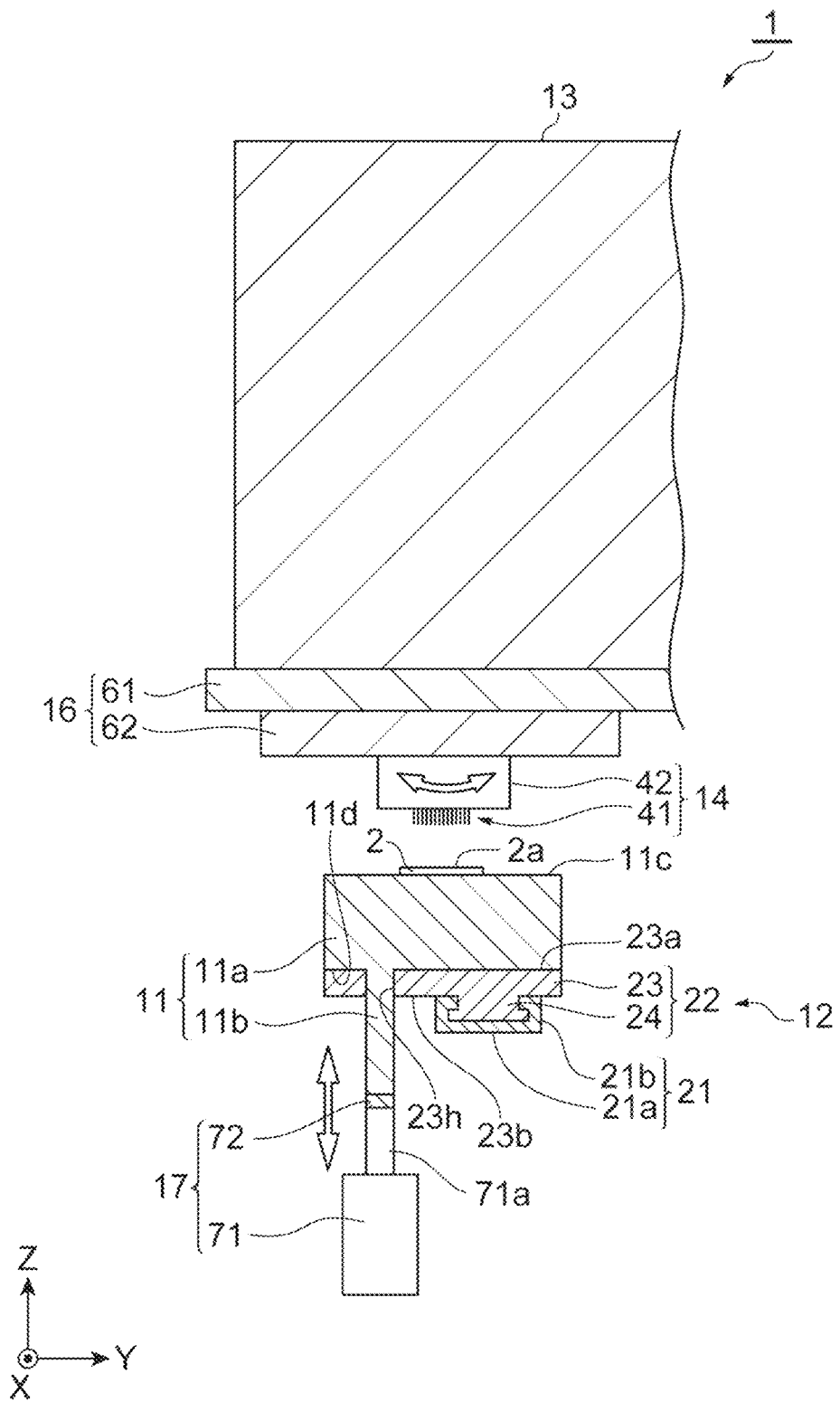
FIG. 2 is a cross-sectional view taken along line II-II of FIG. 1.
Figure 3:
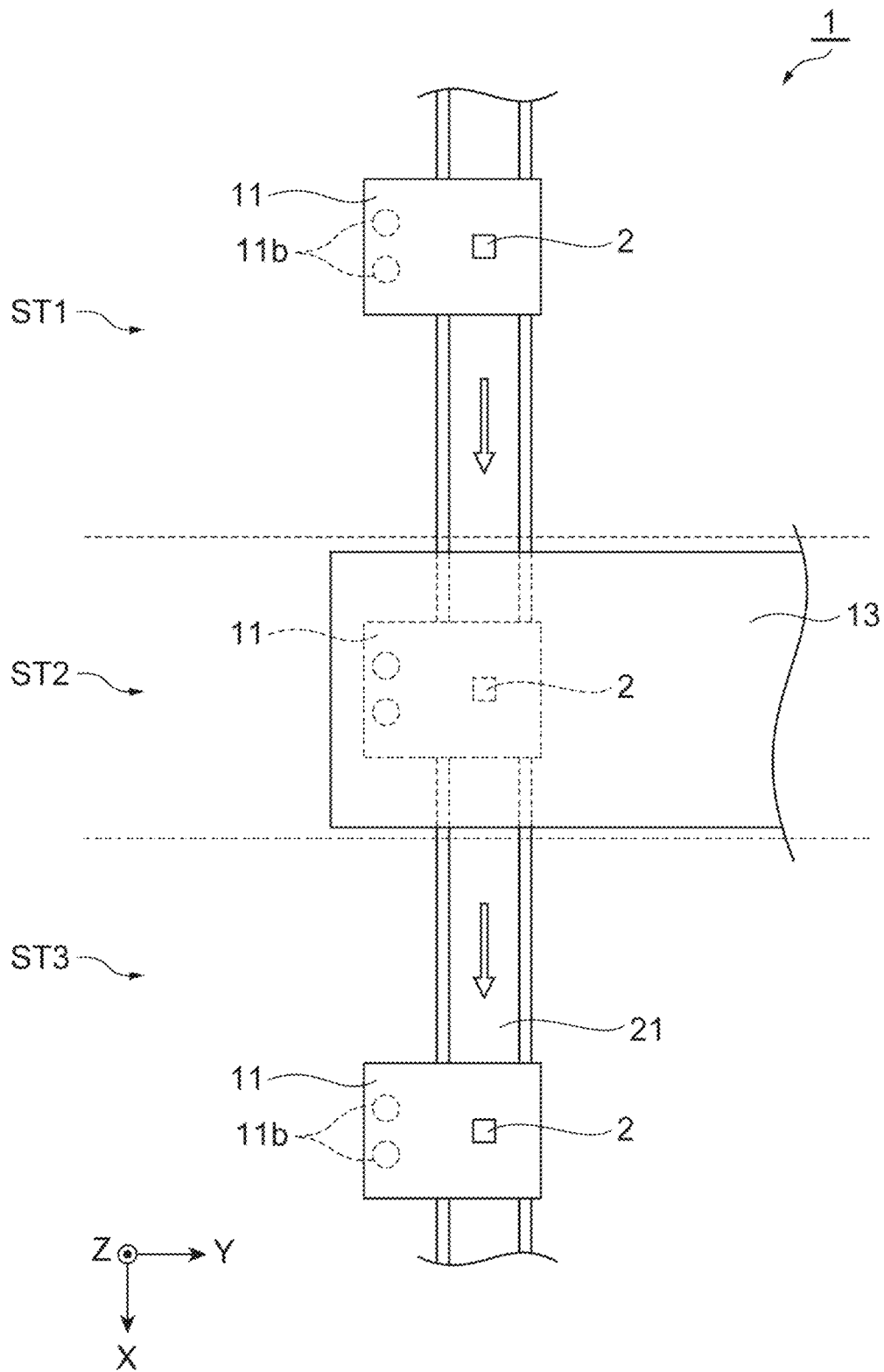
FIG. 3 is a plan view of the test system of FIG. 1.
Figure 4:
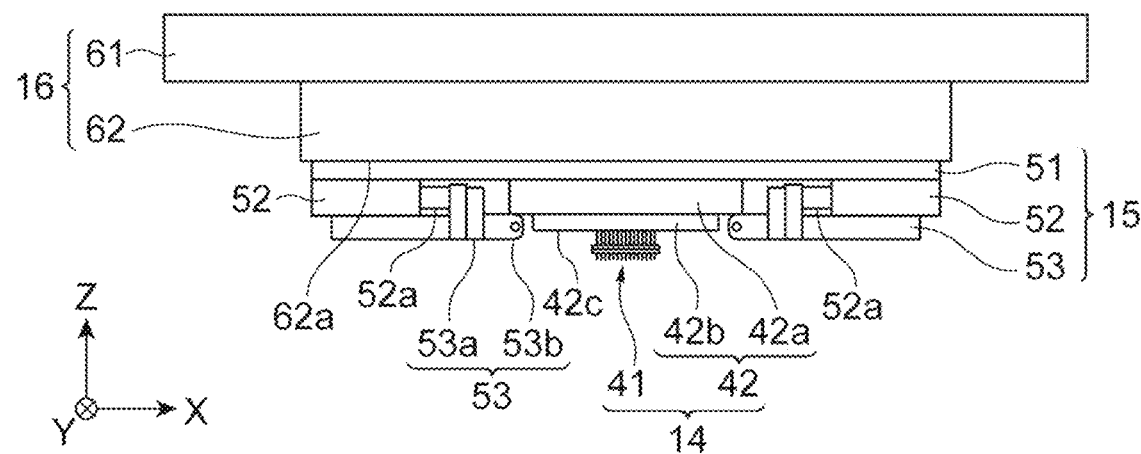
FIG. 4(a) is a diagram schematically illustrating a probe holder retaining a probe unit.
FIG. 4(b) is a diagram schematically illustrating the probe holder from which the probe unit has been removed.
Figure 4:
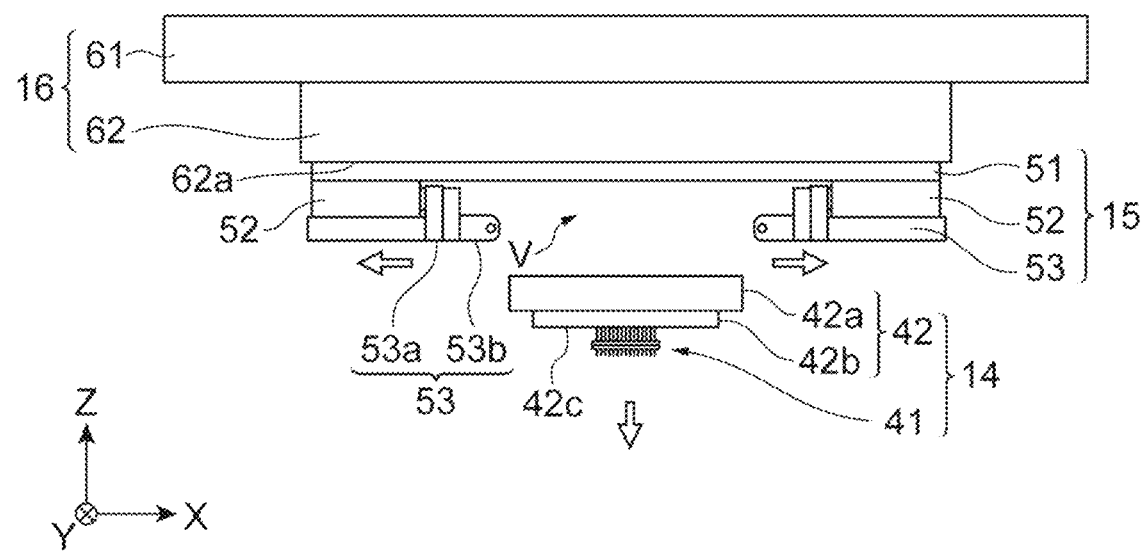

FIG. 1 is an external view schematically illustrating a test system according to a first embodiment. FIG. 2 is a cross-sectional view taken along line II-II of FIG. 1. FIG. 3 is a plan view of the test system of FIG. 1. FIG. 4(a) is a diagram schematically illustrating a probe holder retaining a probe unit. FIG. 4(b) is a diagram schematically illustrating the probe holder from which the probe unit has been removed. The test system 1 illustrated in FIGS. 1 to 3 performs an electrical-characteristic test on a device under test (DUT) 2 that is a device to be tested.

Examples of the DUT 2 include a bare chip of a semiconductor element and a semiconductor module. Examples of the semiconductor element included in the DUT 2 include an insulated gate bipolar transistor (IGBT) and a field effect transistor (FET). The number of types of the DUT 2 that is an object to be tested in the test system 1 is not limited to one, and thus may be at least two. The DUT 2 has a plurality of electrodes. For example, the number of electrodes and the position of electrodes vary depending on the type of the DUT 2. An alignment mark is provided on the upper face 2a of the DUT 2. The alignment mark has a non-rotationally symmetric shape. Not less than two alignment marks may be provided on the upper face 2a of the DUT 2. In this case, the alignment marks are not limited in shape.

The electrical-characteristic test includes a static-characteristic (direct current (DC)) test and a dynamic-characteristic (alternating current (AC)) test on the DUT 2. As the static-characteristic test, characteristics, such as collector breaking current, gate-emitter threshold voltage, gate-emitter leakage current, and collector-emitter saturation voltage may be measured. As the dynamic-characteristic test, for example, switching measurement and short-circuit capability measurement (SC measurement) are performed. Specifically, characteristics, such as total gate charge, turn-on delay time, turn-on rise time, turn-off delay time, turn-off fall time, reverse recovery time, reverse recovery charge, and emitter-collector voltage may be measured.

The test system 1 is a straightforward test system. The test system 1 has three divided regions: a station ST1 (first station), a station ST2 (second station), and a station ST3 (third station). The station ST1 is a region in which carrying-in of the DUT 2 to be inspected is to be performed. The station ST2 is a region in which the electrical-characteristic test is to be performed on the DUT 2. The station ST3 is a region in which carrying-out of the DUT 2 already inspected is to be performed. The stations ST1 to ST3 are arranged along an X-axis direction (second direction) in this order.

The test system 1 includes a mount 11, a conveyance mechanism 12, a test head 13, a probe unit 14, a probe holder 15, an alignment mechanism 16, a lifting and lowering mechanism 17, an imaging device 18 (first imaging device), an imaging device 19 (second imaging device), and a control device 20. Note that, illustration of the probe holder 15 is omitted in FIG. 2 so that the figure is simplified.

The mount 11 is a stand on which the DUT 2 is to be mounted. The mount 11 includes a base 11a and a protrusion 11b. The base 11a is a member having a plate-like shape, the member having an insulating property. The base 11a has an upper face 11c and a lower face 11d. The upper face 11c is a face crossing a Z-axis direction (first direction), on which the DUT 2 is mounted. The DUT 2 is mounted on a previously determined position on the upper face 11c by a mounting robot not illustrated. A suction hole, not illustrated, is provided at the position. The DUT 2 mounted on the mount 11 is sucked through the suction hole, so that the position of the DUT 2 is fixed. Note that, for example, due to the mounting accuracy of the mounting robot, the position of the DUT 2 on the upper face 11c varies every DUT 2.

The lower face 11d is a face crossing the Z-axis direction, the face being opposite to the upper face 11c. The protrusion 11b is a rod-shaped portion extending downward from the lower face 11d along the Z-axis direction. In the present embodiment, two protrusions 11b are provided in series in the X-axis direction. The base 11a and the protrusions 11b may be integrally formed or may be separately formed.

The conveyance mechanism 12 is a mechanism that conveys the mount 11. The conveyance mechanism 12 conveys the mount 11 (DUT 2) in the order of the station ST1, the station ST2, and the station ST3. The conveyance mechanism 12 stops the mount 11 with high accuracy at a previously determined position in each of the stations ST1 to ST3. The stop error of the conveyance mechanism 12 is approximately ±2 μm. The conveyance mechanism 12 is, for example, a linear-motor conveyance mechanism. The conveyance mechanism 12 may be a belt-conveyor conveyance mechanism. The conveyance mechanism 12 includes a conveyance lane 21 and a conveyance stage 22. In a case where the conveyance mechanism 12 is the linear-motor conveyance mechanism, either the conveyance lane 21 or the conveyance stage 22 is a mover and the other is a stator.

The conveyance lane 21 extends linearly along the X-axis direction. The conveyance lane 21 defines the conveyance path of the mount 11 (DUT 2). The conveyance lane 21 is laid across the stations ST1 to ST3. The cross section of the conveyance lane 21 crossing the X-axis direction has a U shape. The conveyance lane 21 has a bottom wall 21a and a pair of side walls 21b. The bottom wall 21a is a plate-shaped member extending in the X-axis direction. The pair of side walls 21b each is a plate-shaped member extending in the X-axis direction, the cross section of the plate-shaped member crossing the X-axis direction, having an L shape. The pair of side walls 21b stands along both ends in a Y-axis direction (third direction) of the bottom wall 21a. The upper ends of the pair of side walls 21b bend in directions in which the upper ends are close to each other. Note that the conveyance lane 21 may further include a path through which the mount 11 returns from the station ST3 to the station ST1.

The conveyance stage 22 is configured to support the mount 11 and move along the conveyance lane 21. The conveyance stage 22 includes a base 23 and a protrusion 24. The base 23 is a plate-shaped member supporting the mount 11. The base 23 has an upper face 23a and a lower face 23b. The upper face 23a is a face crossing the Z-axis direction, on which the mount 11 is mounted. The lower face 23b is a face crossing the Z-axis direction, the face being opposite to the upper face 23a. The base 23 is provided with through holes 23h penetrating through the base 23 in the Z-axis direction. The inner diameters of the through holes 23h are substantially the same as the outer diameters of the protrusions 11b. The protrusions 11b of the mount 11 are inserted through the through holes 23h from the upper face 23a side. The leading end of each protrusion 11b protrudes downward from the lower face 23b.

The protrusion 24 is a portion extending downward from the lower face 23b along the Z-axis direction. The cross section of the protrusion 24 crossing the X-axis direction has a T shape. The lower end of the protrusion 24 protrudes to both sides along the Y-axis direction. The shape allows the protrusion 24 to engage with a groove formed by the bottom wall 21a and the pair of side walls 21b of the conveyance lane 21.

The conveyance mechanism 12 further includes a drive unit not illustrated. When receiving a movement command from the control device 20, the drive unit moves the conveyance stage 22 to the next station and stops the conveyance stage 22 at the previously determined position in the next station. Note that the conveyance mechanism 12 includes a plurality of conveyance stages 22. When one conveyance stage 22 stops in the station ST1, another conveyance stage 22 stops in the station ST2 and still another conveyance stage 22 stops in the station ST3. This arrangement allows performance of parallel processing in the stations.

The test head 13 is a measurement instrument that measures the electrical-characteristics of the DUT 2. The test head 13 includes a measurement circuit 31 for performing the electrical-characteristic test on the DUT 2. The test head 13 provided in the station ST2 is disposed above the conveyance lane 21. When receiving a measurement command from the control device 20, the test head 13 measures the electrical-characteristics of the DUT 2.

The probe unit 14 is a unit that connects the electrodes of the DUT 2 and the test head 13 electrically. For mutually different types of DUTs 2, because the number of electrodes and the position of electrodes vary between the DUTs 2, the probe unit 14 is previously prepared every type of DUTs 2. The probe unit 14 is provided with a tag, such as a bar code and a radio frequency identification (RFID) tag, that stores probe information. The probe information includes information indicating the type of the DUT 2 that is an object to be measured with the probe unit 14, and the identification number of the probe unit 14. The probe unit 14 includes a probe 41 and a probe card 42.

The probe 41 is a member that connects the electrodes of the DUT 2 to the measurement circuit 31 of the test head 13 electrically. The probe 41 includes a plurality of contact needles. The probe 41 may be a scrub probe, a spring probe, or a wire probe. The probe 41 is disposed in accordance with the number and the position of the electrodes of the DUT 2 that is the object to be measured.

The probe card 42 is a member fixing the probe 41 such that the leading-end portion of the probe 41 protrudes. The probe card 42 includes a first portion 42a and a second portion 42b. The first portion 42a and the second portion 42b are plate-shaped members layered along the Z-axis direction. When viewed in the Z-axis direction, the area of the first portion 42a is larger than the area of the second portion 42b, and the outer edge of the first portion 42a is positioned outside the outer edge of the second portion 42b. The probe 41 provided at the second portion 42b protrudes on the opposite side of the first portion 42a. The face 42c of the second portion 42b on the opposite side from the first portion 42a is provided with an alignment mark. The alignment mark has a non-rotationally symmetric shape. Not less than two alignment marks may be provided on the second portion 42b (face 42c). In this case, the alignment marks are not limited in shape.

The probe holder 15 is a member retaining the probe unit 14 (probe 41) detachably. The probe holder 15 is provided on a stage 62 (to be described later) of the alignment mechanism 16. The probe holder 15 includes a base 51, a pair of drive units 52, and a pair of chucks 53. The base 51 that is a plate-shaped member is fixed on the stage 62. The base 51 is provided with an insertion hole (not illustrated) for insertion of an electric wire for connecting the measurement circuit 31 of the test head 13 and the probe 41 electrically. Note that, for example, a flexible cable is used as the electric wire for connecting the measurement circuit 31 and the probe 41 electrically. The pair of drive units 52 is provided on the base 51 such that the drive units 52 face each other in the X-axis direction. For example, an actuator such as a ball screw, an air cylinder, and a solenoid is used as each drive unit 52. The pair of drive units 52 each has a rod 52a extending in the X-axis direction, the rod 52a being capable of reciprocating in the X-axis direction.

The pair of chucks 53 each has an attachment portion 53a and a chuck claw 53b. The attachment portion 53a is fixed at the leading end of the rod 52a. The chuck claw 53b provided at the lower end of the attachment portion 53a extends such that the chuck claw 53b protrudes to the opposite side of the rod 52a in the X-axis direction. The probe holder 15 has a housing space V formed for housing the probe unit 14. The housing space V is a space defined by the base 51 and the pair of chucks 53.

As illustrated in FIG. 4(a), when receiving a retention command for the probe unit 14 from the control device 20, the probe holder 15 grasps the probe card 42 of the probe unit 14, to retain (fix) the probe unit 14. Specifically, the probe unit 14 is housed in the housing space V by a replacement robot not illustrated such that the first portion 42a abuts on the base 51 and the leading end of the probe 41 protrudes downward. The replacement robot is a robot that replaces the probe unit 14, the robot being, for example, an automatic tool changer. When each rod 52a of the pair of drive units 52 moves to the other drive unit 52 in the state, the chuck claws 53b of the pair of chucks 53 come close to each other in the X-axis direction. This arrangement allows the base 51 and the chuck claws 53b to fix the first portion 42a in the Z-axis direction and allows the chuck claws 53b to catch both sides of the second portion 42b in the X-axis direction. In this manner, the probe unit 14 is fixed to the probe holder 15. Note that, for example, due to the fixing accuracy of the probe holder 15, the position of the probe 41 on the probe holder 15 may vary every replacement of the probe unit 14.

Meanwhile, as illustrated in FIG. 4(b), when receiving a removal command for the probe unit 14 from the control device 20, the probe holder 15 releases the fixation of the probe unit 14. Specifically, when each rod 52a of the pair of drive units 52 moves apart from the other drive unit 52, the chuck claws 53b of the pair of chucks 53 move away from each other in the X-axis direction. This arrangement allows the base 51 and the chuck claws 53b to release the fixation of the probe card 42, and the replacement robot not illustrated removes the probe unit 14 from the probe holder 15.

The alignment mechanism 16 is a mechanism that moves the probe 41 (probe unit 14) on an XY plane so as to perform aligning (alignment) of the probe 41 and the electrodes of the DUT 2 on the XY plane. The XY plane is a plane defined by the X-axis direction and the Y-axis direction. The alignment mechanism 16 is provided at the test head 13. The alignment mechanism 16 is capable of moving the probe 41 in the X-axis direction and the Y-axis direction defining the XY plane and is capable of rotating the probe 41 around the Z-axis direction. The alignment mechanism 16 includes a base plate 61 and the stage 62.

The base plate 61 is a plate-shaped member fixed on the lower face of the test head 13. The stage 62 provided on the lower face of the base plate 61 is movable in the X-axis direction and the Y-axis direction and is rotatable around the Z-axis direction, to the base plate 61. The movement mechanism in the X-axis direction and the Y-axis direction and the rotation mechanism around the Z-axis direction may be achieved by publicly known mechanisms. For example, the movement mechanism in the X-axis direction and the Y-axis direction is achieved with a ball screw in the X-axis direction and a ball screw in the Y-axis direction, and the rotation mechanism is achieved with a motor having a shaft extending in the Z-axis direction. The movement mechanism in the X-axis direction and the Y-axis direction and the rotation mechanism around the Z-axis direction may be achieved with three actuators provided on the XY plane. The stage 62 has a lower face 62a. The lower face 62a is a face crossing the Z-axis direction. The base 51 of the probe holder 15 is fixed on the lower face 62a. The base plate 61 and the stage 62 each are provided with an insertion hole (not illustrated) for insertion of the electric wire for connecting the measurement circuit 31 of the test head 13 and the probe 41 electrically.

When receiving an aligning command including the amount of movement in the X-axis direction, the amount of movement in the Y-axis direction, and the angle of rotation around the Z-axis direction, from the control device 20, the alignment mechanism 16 moves the stage 62 in the X-axis direction and the Y-axis direction by the received amounts of movement, and rotates the stage 62 around the Z-axis direction by the received angle of rotation.

The lifting and lowering mechanism 17 is a mechanism that moves the mount 11 along the Z-axis direction. The lifting and lowering mechanism 17 provided in the station ST2 is disposed below the conveyance lane 21. Specifically, the lifting and lowering mechanism 17 lifts or lowers the mount 11 standing in the station ST2, along the Z-axis direction. The lifting and lowering mechanism 17 lifts the mount 11 so that the electrodes of the DUT 2 and the probe 41 are in contact. The lifting and lowering mechanism 17 lowers the mount 11 so that the electrodes of the DUT 2 and the probe 41 are spaced apart. The lifting and lowering mechanism 17 includes a drive unit 71 and a push plate 72.

For example, an actuator such as a ball screw, an air cylinder, and a solenoid is used as the drive unit 71. The drive unit 71 has a rod 71a extending in the Z-axis direction, the rod 71a being capable of reciprocating in the Z-axis direction. The push plate 72 is a plate-shaped member provided at the leading end of the rod 71a, the plate-shaped member being to lift and lower along the Z-axis direction due to the reciprocation of the rod 71a. The push plate 72 has an upper face 72a. The upper face 72a is a face crossing the Z-axis direction, the face being to abut on the leading ends of the protrusions 11b of the mount 11 protruding downward from the base 23 of the conveyance stage 22 when the mount 11 lifts and lowers. When the push plate 72 pushes the leading ends of the protrusions 11b upward, the upper face 23a of the base 23 and the lower face 11d of the base 11a are spaced apart, so that the mount 11 lifts. When the push plate 72 moves downward in a state where the lifting and lowering mechanism 17 keeps the mount 11 pushed upward, the mount 11 lowers. In this manner, the lifting and lowering mechanism 17 lifts and lowers the mount 11.

When receiving a lifting and lowering command including the amount of movement in the Z-axis direction, from the control device 20, the lifting and lowering mechanism 17 moves the rod 71a in the Z-axis direction by the received amount of movement. Note that the lifting and lowering mechanism 17 can lift and lower the mount 11 in the Z-axis direction, in the length range of the protrusions 11b protruding downward from the lower face 23b of the base 23. The length in the Z-axis direction from the lower face 23b to the leading end of each protrusion 11b is longer than the length in the Z-axis direction from the upper face 2a of the DUT 2 to the leading end of the probe 41 in a case where the mount 11 is supported by the conveyance stage 22.

The imaging device 18 is a device that captures (images) the DUT 2 mounted on the mount 11 in the station ST1. The imaging device 18 is, for example, a camera. The imaging device 18 provided in the station ST1 is disposed above the conveyance lane 21. The imaging device 18 having a lens facing downward, captures the DUT 2 mounted on the upper face 11c of the base 11a from above. The capturing range of the imaging device 18 is previously set so that the alignment mark of the DUT 2 is at least captured. When receiving a capturing command from the control device 20, the imaging device 18 performs capturing to acquire an image (hereinafter, referred to as a "device image"). The imaging device 18 transmits the acquired device image to the control device 20.

The imaging device 19 is a device that captures (images) the probe 41 in the station ST2. The imaging device 19 is, for example, a camera. The imaging device 19 provided in the station ST2 is disposed below the test head 13. The imaging device 19 having a lens facing the probe 41, captures the probe 41 retained by the probe holder 15 from below. The capturing range of the imaging device 19 is previously set so that the alignment mark of the probe unit 14 is at least captured. When receiving a capturing command from the control device 20, the imaging device 19 performs capturing to acquire an image (hereinafter, referred to as a "probe image"). The imaging device 18 transmits the acquired probe image to the control device 20.

The control device 20 is a controller that controls the entire test system 1. For example, the control device 20 is provided as a computer system including: a processor such as a central processing unit (CPU); a memory such as a random access memory (RAM) and a read only memory (ROM); an input device such as a touch panel, a mouse, and a keyboard; an output device such as a display; and a communication device including a network card. The function of the control device 20 is achieved by operation of each piece of hardware under the control of the processor based on a computer program stored in the memory.

The control device 20 stores the number of measurements indicating the number of times that a measurement command is transmitted to the test head 13, in the memory not illustrated. The number of measurements is set to zero in factory shipment. The number of measurements is reset to zero by replacement of the probe unit 14. Processing to be performed by the control device 20 will be described in detail below.

Figure 5:
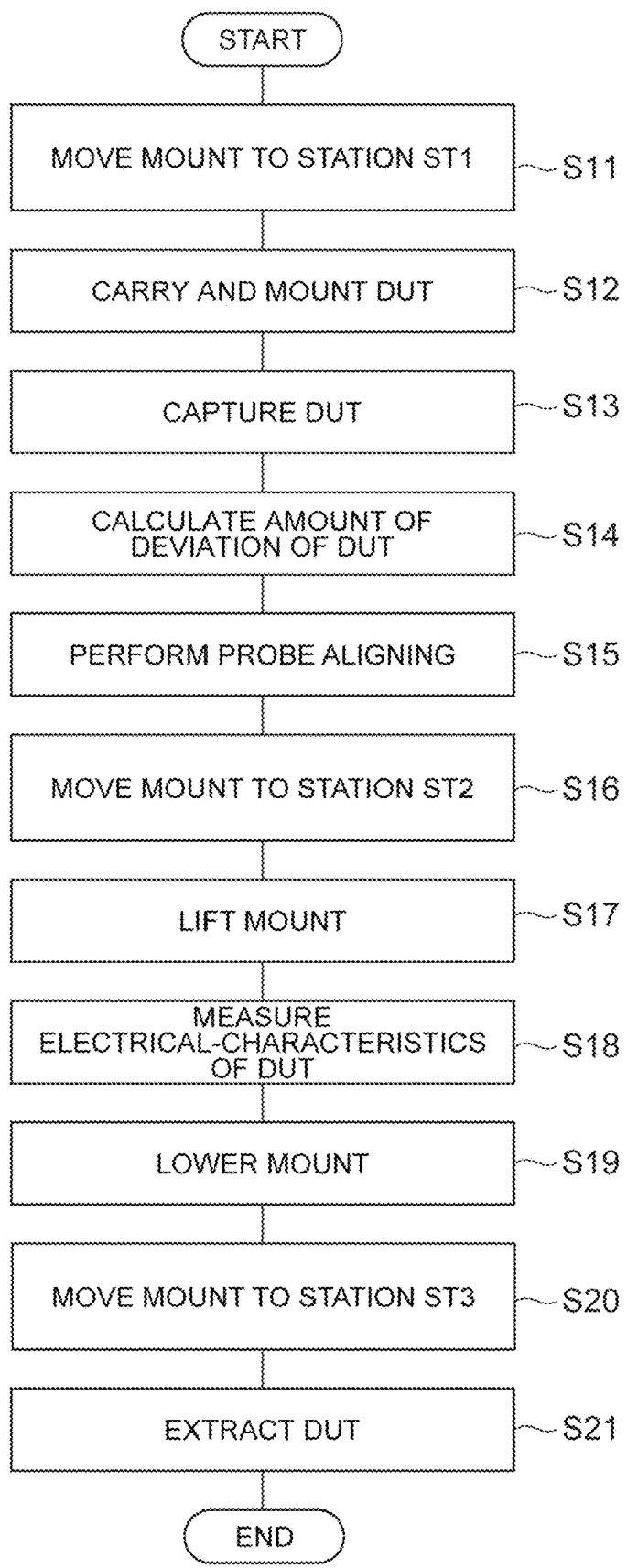
FIG. 5 is a flowchart illustrating a flow of operation in the test system of FIG. 1.

Next, the operation of the test system 1 will be described with reference to FIG. 5. FIG. 5 is a flowchart illustrating a flow of operation in the test system of FIG. 1. The flow of operation illustrated in FIG. 5 starts with completion of the processing in each station as a trigger. Here, focusing on one mount 11, a flow of processing to the one mount 11 will be described.

First, the control device 20 transmits a movement command to the conveyance mechanism 12. When receiving the movement command, the conveyance mechanism 12 moves the mount 11 to the station ST1 (step S11). Specifically, the drive unit not illustrated in the conveyance mechanism 12 moves the conveyance stage 22 to the station ST1 and stops the conveyance stage 22 at the previously determined position in the station ST1. Then, the control device 20 transmits a mounting command to the mounting robot not illustrated. This arrangement allows the mounting robot to carry a DUT 2 to be inspected to mount the DUT 2 onto the mount 11 standing in the station ST1 (step S12). Then, the control device 20 causes the DUT 2 mounted on the mount 11, to be sucked through the suction hole. This arrangement allows fixation of the DUT 2 on the upper face 11c of the mount 11.

Subsequently, the control device 20 transmits a capturing command to the imaging device 18. Then, when receiving the capturing command from the control device 20, the imaging device 18 performs capturing to acquire a device image, and transmits the acquired device image to the control device 20 (step S13). Then, based on the device image, the control device 20 acquires the position of the DUT 2 and calculates the amount of deviation of the DUT 2 (step S14). Specifically, the control device 20 first detects the alignment mark of the DUT 2 in the device image, for example, with pattern matching or edge detection. Then, the control device 20 detects the amount of deviation of the alignment mark from a reference alignment mark, in the device image. The amount of deviation includes the amount of deviation in the X-axis direction, the amount of deviation in the Y-axis direction, and the amount of deviation in the rotation direction around the Z-axis direction (hereinafter, referred to as "the amount of rotation deviation"). The reference alignment mark that is an alignment mark provided to a reference DUT is previously set every type of DUTs 2. The reference DUT is a DUT mounted on the mount 11 in an attitude in which the probe 41 set at a reference position and at a reference rotation-angle can measure the electrical-characteristics of the DUT. The reference DUT is previously set every type of DUTs 2. That is, in a case where the reference alignment mark and the alignment mark are positioned in alignment with each other in the device image, the amount of deviation of the DUT 2 is zero.

Then, the control device 20 calculates, from the detected amount of deviation, the amount of movement in the X-axis direction, the amount of movement in the Y-axis direction, and the angle of rotation around the Z-axis direction so that the attitude of the reference DUT is identical to the attitude of the DUT 2 on the mount 11. For example, because there are constant ratios between the lengths in the X-axis direction and the Y-axis direction in the device image and the lengths in the X-axis direction and the Y-axis direction on the mount 11, the control device 20 converts the amounts of deviation in the X-axis direction and the Y-axis direction in the device image, into the amounts of deviation in the X-axis direction and the Y-axis direction on the mount 11, and renders the amount of rotation deviation in the device image as the amount of rotation deviation on the mount 11. Then, the control device 20 calculates the amount of movement in the X-axis direction, the amount of movement in the Y-axis direction, and the angle of rotation around the Z-axis direction such that the amounts of deviation in the X-axis direction and the Y-axis direction and the amount of rotation deviation are zero. Then, the control device 20 transmits, to the alignment mechanism 16, an aligning command including the amount of movement in the X-axis direction, the amount of movement in the Y-axis direction, and the angle of rotation around the Z-axis direction.

Subsequently, when receiving the aligning command from the control device 20, the alignment mechanism 16 moves the stage 62 in the X-axis direction and the Y-axis direction by the received amounts of movement and rotates the stage 62 around the Z-axis direction by the received angle of rotation. This arrangement allows positioning of the probe 41 and the electrodes of the DUT 2 in alignment with each other (step S15).

Subsequently, the control device 20 transmits a movement command to the conveyance mechanism 12. When receiving the movement command, the conveyance mechanism 12 moves the mount 11 standing in the station ST1, to the station ST2 (step S16).

Specifically, the drive unit not illustrated in the conveyance mechanism 12 moves the conveyance stage 22 standing in the station ST1, to the station ST2 and stops the conveyance stage 22 at the previously determined position in the station ST2. Then, the control device 20 transmits a lifting and lowering command for lifting the mount 11, to the lifting and lowering mechanism 17. Note that, the length in the Z-axis direction from the upper face 2a of the DUT 2 to the leading end of the probe 41 when the mount 11 is supported by the conveyance stage 22, has a fixed value determined every type of DUTs 2. Thus, the control device 20 transmits, to the lifting and lowering mechanism 17, the lifting and lowering command including the amount of movement indicating a lift for the fixed value.

Then, when receiving the lifting and lowering command from the control device 20, the lifting and lowering mechanism 17 moves the rod 71a in the Z-axis direction by the received amount of movement. This arrangement allows the upper face 72a of the push plate 72 to abut on the leading ends of the protrusions 11b of the mount 11. When the push plate 72 further moves upward, the upper face 72a pushes the leading ends of the protrusions 11b upward. Then, the upper face 23a of the base 23 and the lower face 11d of the base 11a are spaced apart, so that the mount 11 lifts (step S17). Then, the lifting and lowering mechanism 17 lifts the mount 11 until the leading end of the probe 41 comes in contact with the electrodes of the DUT 2. This arrangement allows the electrodes of the DUT 2 to connect to the measurement circuit 31 of the test head 13 electrically.

Subsequently, the control device 20 transmits a measurement command to the test head 13. At this time, the control device 20 increments the number of measurement by 1. Then, when receiving the measurement command from the control device 20, the test head 13 measures the electrical-characteristics of the DUT 2 with the measurement circuit 31 (step S18). When the measurement of the electrical-characteristics finishes, the control device 20 transmits a lifting and lowering command for lowering the mount 11, to the lifting and lowering mechanism 17. The amount of movement included in the lifting and lowering command is the amount of movement indicating a lowering for the fixed value described above.

Then, when receiving the lifting and lowering command from the control device 20, the lifting and lowering mechanism 17 moves the rod 71a in the Z-axis direction by the received amount of movement. This arrangement allows the push plate 72 to move downward, so that the mount 11 lowers (step S19). Then, the electrodes of the DUT 2 are spaced apart from the leading end of the probe 41, and the electrodes of the DUT 2 are electrically disconnected from the measurement circuit 31 of the test head 13. The push plate 72 further moves downward, so that the lower face 11d of the base 11a is in contact with the upper face 23a of the base 23. In this manner, the state where the mount 11 is supported by the conveyance stage 22 returns.

Subsequently, the control device 20 transmits a movement command to the conveyance mechanism 12. When receiving the movement command, the conveyance mechanism 12 moves the mount 11 standing in the station ST2, to the station ST3 (step S20). Specifically, the drive unit not illustrated in the conveyance mechanism 12 moves the conveyance stage 22 standing in the station ST2, to the station ST3 and stops the conveyance stage 22 at the previously determined position in the station ST3. Then, the control device 20 releases the suction through the suction hole. Then, the control device 20 transmits a carrying-out command to a carrying-out robot not illustrated. This arrangement allows the carrying-out robot to carry out the DUT 2 already inspected from the mount 11 (step S21). In this manner, the flow of operation of the test system 1 to the one mount 11 finishes. After the processing at step S21 finishes, the processing may further go back to step S11 and the flow of processing may be repeated.

As described above, in the test system 1, a device image is acquired after a DUT 2 to be inspected is carried in and is mounted on a mount 11 in the station ST1, an electrical-characteristic test is performed on the DUT 2 in the station ST2, and the DUT 2 already inspected is carried out from the mount 11 in the station ST3.

Note that not less than three mounts 11 are conveyed by the conveyance mechanism 12, and one mount 11 stops in each station. Then, when the processing finishes in each station, the control device 20 controls the conveyance mechanism 12 to move the mounts 11 (conveyance stages 22) to the next stations. Thus, the processing at steps S11 to S15 to one mount 11, the processing at steps S16 to S19 to another mount 11, and the processing at steps S20 and S21 to still another 11 are performed in parallel. In this case, the processing at step S15 is performed after completion of the processing at step S18.

Figure 6:
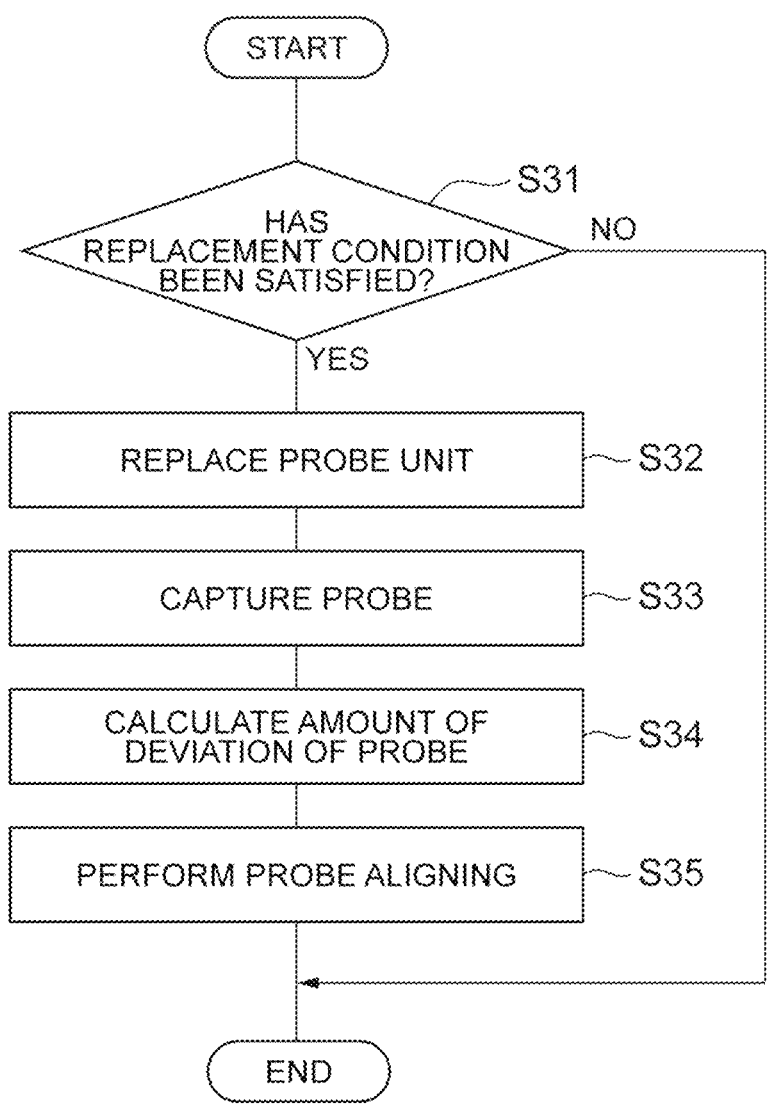
FIG. 6 is a flowchart illustrating a flow of operation in replacement processing of a probe unit.

Next, replacement processing of a probe unit will be described with reference to FIG. 6. FIG. 6 is a flowchart illustrating a flow of operation in the replacement processing of a probe unit. For example, the flow of operation illustrated in FIG. 6 starts with performance of the electrical-characteristics of a DUT 2 or input of an instruction from an operator through the input device as a trigger. The probe unit 14 may be replaced with the same type of probe unit 14 or may be replaced with a different type of probe unit 14.

The control device 20 first determines whether the replacement condition of the probe unit 14 has been satisfied (step S31). For example, the control device 20 determines that the replacement condition has been satisfied, in a case where the number of measurements has reached a previously determined number. The control device 20 determines that the replacement condition has been satisfied, in a case where the operator has input a replacement instruction. The replacement instruction is issued, for example, for switching between types of DUTs 2. In a case where determining that the replacement condition has not been satisfied (step S31; NO), the control device 20 finishes the replacement processing of a probe unit.

Meanwhile, in case where it is determined at step S31 that the replacement condition has been satisfied (step S31; YES), the probe unit 14 is replaced (step S32). As a specific description, the control device 20 first transmits a removal command for the probe unit 14, to the replacement robot and the probe holder 15. Then, when receiving the removal command for the probe unit 14 from the control device 20, the probe holder 15 releases the fixation of the probe unit 14 and the replacement robot not illustrated removes the probe unit 14 from the probe holder 15.

Subsequently, the control device 20 transmits, to the replacement robot, a pickup command including classification information indicating the type of a new probe unit 14 to be attached. Then, when receiving the pickup command from the control device 20, the replacement robot acquires a type of probe unit 14 indicated by the classification information in the pickup command, from a storage location in which unused probe units 14 are stored. At this time, the replacement robot reads the tags provided to the probe units 14, to select the type of probe unit 14 indicated by the classification information in the pickup command, from the unused probe units 14. Then, the replacement robot houses the probe unit 14 into the housing space V such that the first portion 42a of the probe card 42 abuts on the base 51 and the leading end of the probe 41 protrudes downward.

Then, the control device 20 transmits a retention command for the probe unit 14 to the probe holder 15. Then, when receiving the retention command for the probe unit 14 from the control device 20, the probe holder 15 grasps the probe card 42 of the probe unit 14, to retain (fix) the probe unit 14. In this manner, the probe unit 14 is replaced. Then, the control device 20 resets the number of measurements to zero.

Subsequently, the control device 20 transmits a capturing command to the imaging device 19. Then, when receiving the capturing command from the control device 20, the imaging device 19 performs capturing to acquire a probe image, and transmits the acquired probe image to the control device 20 (step S33). Then, based on the probe image, the control device 20 acquires the position of the probe 41 and calculates the amount of deviation of the probe 41 (step S34). Specifically, the control device 20 first detects the alignment mark of the probe unit 14 in the probe image, for example, with pattern matching or edge detection. Then, the control device 20 detects the amount of deviation of the alignment mark from a reference alignment mark, in the probe image. The amount of deviation includes the amount of deviation in the X-axis direction, the amount of deviation in the Y-axis direction, and the amount of rotation deviation. The reference alignment mark that is an alignment mark provided to a reference probe is previously set every type of probe units 14. The reference probe that is a probe set at a reference position and at a reference rotation-angle is previously set every type of probe units 14. That is, in a case where the reference alignment mark and the alignment mark are positioned in alignment with each other in the probe image, the amount of deviation of the probe 41 is zero.

Then, the control device 20 calculates, from the detected amount of deviation, the amount of movement in the X-axis direction, the amount of movement in the Y-axis direction, and the angle of rotation around the Z-axis direction so that the attitude of the probe 41 is identical to the attitude of the reference probe. For example, because there are constant ratios between the lengths in the X-axis direction and the Y-axis direction in the probe image and the lengths in the X-axis direction and the Y-axis direction on the probe holder 15, the control device 20 converts the amounts of deviation in the X-axis direction and the Y-axis direction in the probe image, into the amounts of deviation in the X-axis direction and the Y-axis direction on the probe holder 15, and renders the amount of rotation deviation in the probe image as the amount of rotation deviation on the probe holder 15. Then, the control device 20 calculates the amount of movement in the X-axis direction, the amount of movement in the Y-axis direction, and the angle of rotation around the Z-axis direction such that the amounts of deviation in the X-axis direction and the Y-axis direction and the amount of rotation deviation are zero. Then, the control device 20 transmits, to the alignment mechanism 16, an aligning command including the amount of movement in the X-axis direction, the amount of movement in the Y-axis direction, and the angle of rotation around the Z-axis direction.

Then, when receiving the aligning command from the control device 20, the alignment mechanism 16 moves the stage 62 in the X-axis direction and the Y-axis direction by the received amounts of movement and rotates the stage 62 around the Z-axis direction by the received angle of rotation. This arrangement allows the probe 41 to be set at the reference position and at the reference rotation-angle (step S35). In this manner, the flow of operation in the replacement processing of the probe unit 14 finishes.

As described above, in the test system 1, when the replacement condition of the probe unit 14 is satisfied, the probe unit 14 is replaced and then the alignment of the replaced probe 41 is performed. Note that the processing at steps S33 and S34 may be performed every electrical-characteristic test as well as in replacement of the probe unit 14. In this case, the processing at steps S33 and S34 is performed in parallel with the processing at steps S13 and S14. At step S15, the probe 41 and the electrodes of the DUT 2 may be positioned in alignment with each other, with the amount of deviation of the probe 41 and the amount of deviation of the DUT 2. In this case, step S35 may be omitted.

As described above, in the test system 1, the probe 41 (probe unit 14) moves on the XY plane, so that the position of the probe 41 is aligned with the position of electrodes of the DUT 2. Specifically, the position of the probe 41 is aligned with the position of electrodes of the DUT 2 by moving the probe 41 in the X-axis direction and the Y-axis direction and rotating the probe 41 around the Z-axis direction. Then, the lifting and lowering mechanism 17 moves the mount 11 on which the DUT 2 is mounted, along the Z-axis direction, so that the electrodes of the DUT 2 are in contact with the probe 41. This arrangement allows performance of the electrical-characteristic test on the DUT 2 with the measurement circuit 31. After the performance of the electrical-characteristic test, the electrodes of the DUT 2 are spaced apart from the probe 41 by moving the mount 11 along the Z-axis direction. Thus, because the mount 11 on which the DUT 2 is mounted is provided with no movement mechanism and no rotation mechanism for the aligning of the electrodes of the DUT 2 and the probe 41, the weight of the mount 11 can be reduced in comparison to that of a mount provided with a triaxial movement mechanism and a rotation mechanism. This arrangement makes it possible to shorten the conveyance time of the mount 11 by the conveyance mechanism 12. It also makes it possible to shorten the lifting and lowering time of the mount 11 by the lifting and lowering mechanism 17.

The mount 11 moves (lifts or lowers) along the Z-axis direction in order to render the electrodes of the DUT 2 and the probe 41 in contact or spaced apart, whereas the probe 41 does not move (lower or lift) along the Z-axis direction. Thus, because the distance in the Z-axis direction between the probe 41 and the measurement circuit 31 does not vary during the operation of the test system 1, there is no need to lengthen the length of the electric wire for electrically connecting the probe 41 and the measurement circuit 31 more than necessary. This arrangement enables reduction of the inductance component in the electric wire in comparison to that of a probe provided with a triaxial movement mechanism and a rotation mechanism. As a result, the conveyance time can be shortened with no deterioration in the accuracy of measurement.

In the test system 1, the probe unit 14 and the probe holder 15 move in the X-axis direction and the Y-axis direction, and rotate around the Z-axis direction. Thus, because the test head 13 is fixed and does not move, the measurement circuit 31 is inhibited from failing due to vibration.

The conveyance mechanism 12 conveys a mount 11 in the order of the station ST1 for mounting a DUT 2 to be inspected on the mount 11, the station ST2 for performing an electrical-characteristic test, and the station ST3 for carrying out the DUT 2 already inspected from the mount 11. Use of at least three mounts 11 enables parallel performance of mounting of a DUT 2, performance of an electrical-characteristic test, and carrying-out of a DUT 2, so that the efficiency of inspection can improve.

The alignment mechanism 16 performs aligning of the electrodes of the DUT 2 and the probe 41, based on the device image acquired by the imaging device 18. The acquisition of the device image is performed in the station ST1, and the electrical-characteristic test is performed in the station ST2. That is the alignment of the probe 41 is performed in the station ST2, based on the device image in the station ST1. Thus, because the mount 11 needs to stop at the previously determined positions in the stations ST1 and ST2, it is required that the mount 11 be accurately stopped. As described above, because the mount 11 is made lighter in weight, the inertial force that acts on the mount 11 is reduced. Thus, because the time necessary for the mount 11 to stop can be shortened, the conveyance time of the mount 11 can be shortened. Because the device image is acquired in the station ST1, the alignment of the probe 41 can be performed before the mount 11 is conveyed to the station ST2. This arrangement enables the efficiency of inspection to improve.

Because the probe holder 15 retains the probe 41 (probe unit 14) detachably, the probe 41 can be replaced. For example, due to the accuracy of retaining the probe 41 by the probe holder 15, the position of the probe 41 on the probe holder 15 may vary every replacement of the probe 41. In contrast to this, the alignment mechanism 16 performs aligning of the electrodes of the DUT 2 and the probe 41, based on the probe image acquired by the imaging device 19. This arrangement enables acquisition of the position of the probe 41 based on the probe image, so that the electrodes of the DUT 2 and the probe 41 can be aligned more accurately with each other.

Figure 7:
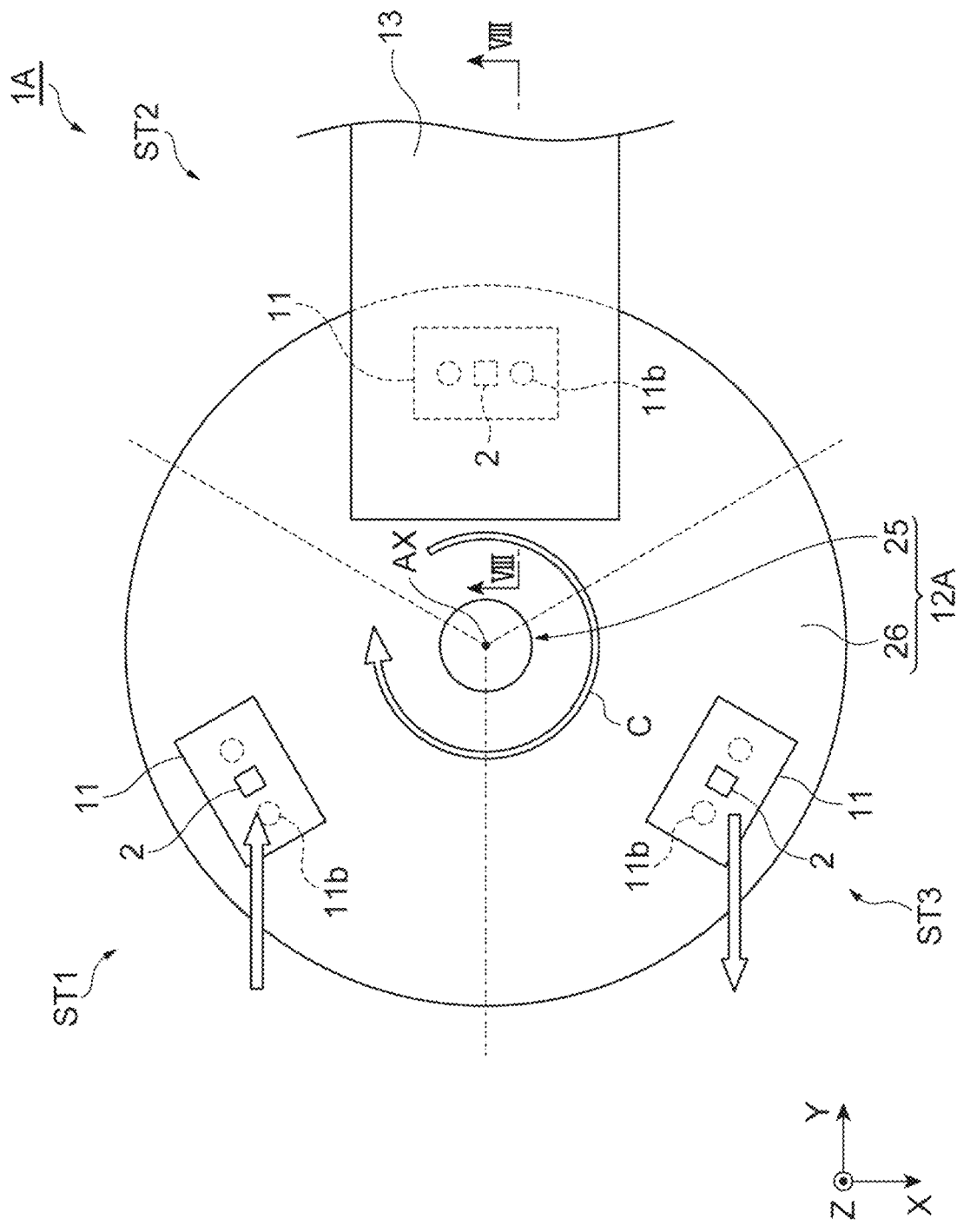
FIG. 7 is a plan view schematically illustrating a test system according to a second embodiment.
Figure 8:
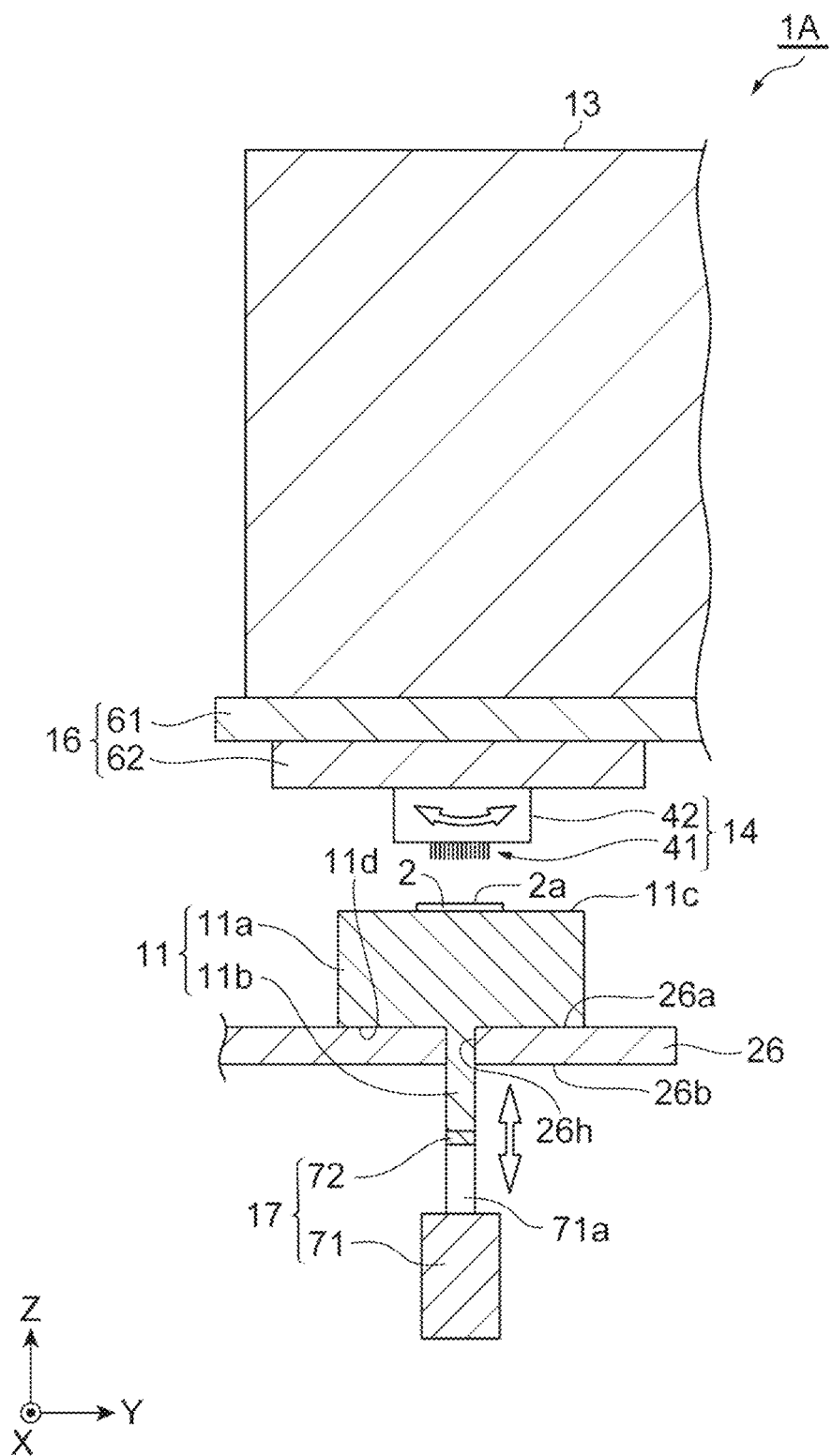
FIG. 8 is a cross-sectional view taken along line VIII-VIII of FIG. 7.

FIG. 7 is a plan view schematically illustrating a test system according to a second embodiment. FIG. 8 is a cross-sectional view taken along line VIII-VIII of FIG. 7. The test system 1A illustrated in FIGS. 7 and 8 is a rotational test system. The test system 1A is mainly different from the test system 1 in terms of including a conveyance mechanism 12A instead of the conveyance mechanism 12. Note that illustration of a probe holder 15 is omitted in FIG. 8 so that the figure is simplified, similarly to FIG. 2.

The conveyance mechanism 12A is mainly different from the conveyance mechanism 12 in terms of including a drive unit 25 and a rotational table 26 instead of the conveyance lane 21, the conveyance stages 22, and the drive not illustrated. The conveyance mechanism 12A conveys a DUT 2 (mount 11) circularly in the order of a station ST1, a station ST2, and a station ST3. The stations ST1 to ST3 are arranged in the order in a rotation direction C around the central axis AX of the rotational table 26.

The drive unit 25 rotates the rotational table 26 in the rotation direction C around the central axis AX of the rotational table 26. In the present embodiment, the rotation direction C is clockwise in plan view, but may be counterclockwise in plan view. For example, the drive unit 25 may include a motor. The rotational table 26 is a plate-shaped member supporting the mount 11. In the present embodiment, the shape of the rotational table 26 viewed in a Z-axis direction is circular. The central axis AX of the rotational table 26 is an axis extending in the Z-axis direction, and is, for example, positioned at the center of the rotational table 26 viewed in the Z-axis direction (the center of the circle). The rotational table 26 has an upper face 26a and a lower face 26b. The upper face 26a is a face crossing the Z-axis direction, on which the mount 11 is mounted. The lower face 26b is a face crossing the Z-axis direction, the face being opposite to the upper face 26a. Through holes 26h penetrating through the rotational table 26 in the Z-axis direction are provided at the rotational table 26. The inner diameters of the through holes 26h are substantially the same as the outer diameters of protrusions 11b. The protrusions 11b of the mount 11 are inserted through the through holes 26h from the upper face 26a side, and the leading end of each protrusion 11b protrudes downward from the lower face 26b.

When the conveyance mechanism 12A receives a movement command from a control device 20, the drive unit 25 rotates the rotational table 26. The drive unit 25 rotates the rotational table 26 in the rotation direction C, so that the mount 11 moves to the next station and stops at a previously determined position in the next station. Note that three mounts 11 are mounted on the conveyance mechanism 12A. One mount 11 stops in the station ST1, another mount 11 stops in the station ST2, and the other mount 11 stops in the station ST3, so that parallel processing is performed in the stations.

The test system 1A above has an effect similar to that of the test system 1 described above.

Note that a test system according to the present invention is not limited to the embodiments.

For example, the imaging device 18 may be provided in the station ST2. In this case, the amount of deviation of the DUT 2, including the error in stopping the mount 11 (conveyance stage 22) by the conveyance mechanism 12 can be calculated. Thus, the accuracy of aligning of the probe 41 and the electrodes of the DUT 2 can improve.

The test system 1 does not necessarily include at least one of the imaging device 18 and the imaging device 19. For example, the device image and the probe image may be acquired from the outside of the test system 1. Information from which the position of the DUT 2 and the position of the probe 41 can be specified may be used instead of the device image and the probe image.

If the maximum value of the amount of deviation of the DUT 2 is the extent that the electrodes of the DUT 2 and the probe 41 are not spaced apart, the alignment based on the device image may be omitted. In this case, the test system 1 does not necessarily include the imaging device 18. If the maximum value of the amount of deviation of the probe unit 14 (probe 41) is the extent that the electrodes of the DUT 2 and the probe 41 are not spaced apart, the alignment based on the probe image may be omitted. In this case, the test system 1 does not necessarily include the imaging device 19.

If the probe unit 14 is not replaced, the probe holder 15 does not necessarily retain the probe unit 14 detachably, and thus the imaging device 19 is not necessarily provided.

The number of stations in the test system 1 is not limited to three. For example, in one station, a DUT 2 may be mounted on a mount 11, the electrical-characteristic test may be performed on the DUT 2, and the DUT 2 may be carried out from the mount 11. The station ST2 may be further divided into a station for performing the static-characteristic test and a station for performing the dynamic-characteristic test.

REFERENCE SIGNS LIST 1, 1A test system
2 DUT
11 mount
12, 12A conveyance mechanism
13 test head
14 probe unit
15 probe holder
16 alignment mechanism
17 lifting and lowering mechanism
18 imaging device (first imaging device)
19 imaging device (second imaging device)
20 control device
31 measurement circuit
41 probe
ST1 station (first station)
ST2 station (second station)
ST3 station (third station)

The invention claimed is:

1. A test system configured to perform an electrical-characteristic test on a device under test, the test system comprising:
a mount on which the device under test is to be mounted;
a conveyor configured to convey the mount;

a test head including a measurement circuit for performing the electrical-characteristic test;

a probe configured to connect an electrode of the device under test to the measurement circuit;

a lifter configured to move the mount along a first direction such that the electrode and the probe are in contact or spaced apart; and an aligner provided at the test head, the aligner being configured to move the probe on a plane crossing the first direction so as to perform aligning the probe with the electrode on the plane, wherein the conveyor conveys the mount in order of a first station for mounting the device under test on the mount, a second station for performing the electrical-characteristic test, and a third station for carrying out the device under test from the mount.

2. The test system according to claim 1, further comprising: a first imaging device configured to capture the device under test mounted on the mount in the first station, wherein the aligner performs the aligning, based on an image of the device under test captured by the first imaging device.

3. The test system according to claim 1, further comprising:

a probe holder configured to retain the probe detachably; and a second imaging device configured to capture the probe, wherein the aligner performs the aligning, based on an image of the probe captured by the second imaging device.

4. The test system according to claim 2, further comprising:

a probe holder configured to retain the probe detachably; and a second imaging device configured to capture the probe, wherein the aligner performs the aligning, based on an image of the probe captured by the second imaging device.

5. The test system according to claim 1, wherein the aligner is capable of moving the probe in a second direction and a third direction defining the plane, and is capable of rotating the probe around the first direction.

6. The test system according to claim 2, wherein the aligner is capable of moving the probe in a second direction and a third direction defining the plane, and is capable of rotating the probe around the first direction.

7. The test system according to claim 3, wherein the aligner is capable of moving the probe in a second direction and a third direction defining the plane, and is capable of rotating the probe around the first direction.

8. The test system according to claim 4, wherein the aligner is capable of moving the probe in a second direction and a third direction defining the plane, and is capable of rotating the probe around the first direction.

* * * * *